(12) United States Patent
Sasao (10) Patent No.: US 8,352,677 B2
(45) Date of Patent: Jan. 8, 2013

(54) ASSOCIATIVE MEMORY

(75) Inventor: Tsutomu Sasao, Iizuka (JP)

(73) Assignee: Kyushu Institute of Technology, Kitakyushu-Shi (JP)

( * ) Notice: Subject to any disclaimer, the term of this patent is extended or adjusted under 35 U.S.C. 154(b) by 538 days.

(21) Appl. No.: 12/294,786

(22) PCT Filed: Mar. 27, 2007

(86) PCT No.: PCT/JP2007/056498
§ 371 (c)(1),
(2), (4) Date: May 20, 2010

(87) PCT Pub. No.: WO2007/119540
PCT Pub. Date: Oct. 25, 2007

(65) Prior Publication Data
US 2010/0228911 A1    Sep. 9, 2010

(30) Foreign Application Priority Data
Mar. 31, 2006   (JP) ................... 2006-101106

(51) Int. Cl.
*G11C 15/00*   (2006.01)
(52) U.S. Cl. ..................... 711/108; 365/49.17
(58) Field of Classification Search .......... 711/108; 365/49.17
See application file for complete search history.

(56) References Cited

U.S. PATENT DOCUMENTS

| 2005/0010719 A1* | 1/2005 | Slavin ............. | 711/108 |
| 2007/0094441 A1* | 4/2007 | Kim et al. ........ | 711/108 |

FOREIGN PATENT DOCUMENTS

| JP | 2000-105770    | 4/2000 |
| JP | 2002-334114 A1 | 11/2002 |
| JP | 2003-389264 A1 | 11/2003 |
| JP | 2004-229163 A1 | 8/2004 |
| JP | 2004-258799 A1 | 9/2004 |
| JP | 2004-295967 A1 | 10/2004 |

OTHER PUBLICATIONS

Susumu Koyama; "Ultrahigh-speed MOS Device;" Ultrahigh-speed Digital Device Series; vol. 2; Feb. 10, 1986; pp. 324-326 and Cover Sheet (4 Sheets total); Baifukan, Tokyo, Japan.

(Continued)

*Primary Examiner* — Jared Rutz
(74) *Attorney, Agent, or Firm* — Kratz, Quintos & Hanson, LLP (57) ABSTRACT

The associative memory comprises a simplified functional processing unit (SFPU), implemented by an LUT logic network, that implements simplified CAM function g, where g is the function derived from CAM function $f$ by replacing the value showing "invalid" with the don't care, an auxiliary memory that stores the inverse function $f^{-1}$ of said CAM function $f$; and an output modifier that checks whether the output value of said SFPU is equal to the output value of the CAM function $f$; wherein the SFPU produces the operational value ("tentative index value") for the simplified CAM function g; the auxiliary memory produces the value of the inverse function $f^{-1}$ when the tentative index value is applied; the output modifier compares the input data with the value of the inverse function $f^{-1}$, and produces the output of said SFPU if they are the same, otherwise produces the signal showing the "invalid".

3 Claims, 9 Drawing Sheets

OTHER PUBLICATIONS

The Institute of Electronics and Communication Engineers; LSI Handbook; Nov. 30, 1984; pp. 522-525 and Cover Sheet (5 Sheets total); Ohmsha, Tokyo, Japan.

Kostas Pagiamtzis, et al.; "A Low-Power Content-Addressable Memory (CAM) Using Pipelined Hierarchical Search Scheme;" IEEE Journal of Solid-State Circuits, vol. 39; No. 9; Sep. 2004; pp. 1512-1519.

Tsutomu Sasao, et al; "A Cascade Realization of Multiple-Output Function for Reconfigurable Hardware;" International Workshop on Logic and Synthesis (IWLS01); Lake Tahoe, California; Jun. 12-15, 2001; pp. 1-6.

Tsutomu Sasao, et al; "BDD Representation for Incompletely Specified Multiple-Output Logic Functions and Its Applications to Functional Decomposition;" Design Automation Conference; Jun. 2005; pp. 373-378.

Yukihiro Iguchi, et al.; "On Look-Up Table Cascade Architecture;" Institute of Electrical Engineers of Japan Conference: Electronics, Information , and System Section,MC2-4; Akita University, Akita, Japan; Aug. 29-30, 2003; 6 Sheets and 2 Cover Sheets (8 Sheets total).

Tsutomu Sasao; "Design Methods for Multiple-Valued Input Address Generators;" 36th International Symposium on Multiple-Valued Logic (ISMVL '06); May 2006; 10 Sheets total.

International Search Report for International Application No. PCT/JP2007/056498 dated May 30, 2007.

* cited by examiner

ASSOCIATIVE MEMORY

TECHNICAL FIELD

This invention is concerned with an associative memory (Content Addressable Memory: denoted by "CAM"), especially with an associative memory performing high speed search, dissipating low power, and requiring a small area.

BACKGROUND ART

For a given index (address), an ordinary memory generates the registered data stored in that address. On the other hand, a CAM generates the index (address) of a given search (input) data, (See non-patent literature 1, 2) stored in the CAM.

CAMs are used in wide area such as pattern matching, routers for internet, cache for processor, TLB (Translation Lookaside Buffer), data compression, accelerator for a database, neural network, and memory patch.

From their functions, CAMs are usually classified into two types: The first one is a Binary CAM ("BCAM"), and the second one is a ternary CAM ("TCAM"). In the BCAM, each cell stores either 0 or 1. On the other hand, in the TCAM, each cell stores either 0, 1, or *. where, '*' denotes a "don't care", which matches both 0 and 1.

[Definition 1] (BCAM)

An n-input BCAM table with p registered vectors stores, p different two-valued vectors. We assume that p vectors are stored in the BCAM from the address 1 to the address p, in order. Note that an address of each vector can be represented by m bits. m is given by (1).

[Expression 1]

$$m = \lceil \log_2(p+1) \rceil \quad (1)$$

The corresponding BCAM function $f: \{0,1\}^n \rightarrow \{0,1\}^m$ satisfies the following condition:

For the given input x, if the same vector exist in the BCAM table, then $f(x)$ produces the CAM address (from 1 to p) that stores the vector x. If no vector in the BCAM table matches to the input x, then the value of $f(x)$ is 0.

(End of Definition)

EXAMPLE 1

(Table 1) shows the BCAM storing 7 two-valued vectors. The corresponding BCAM function is shown in Table 2. In both cases, they produce the address that stores the vector exactly matching to the input data by a 3-bit number (e.g., '011'). When no vector in the BCAM matches to the input vector, the BCAM produces '0'.

(End of Example)

TABLE 1

Example of a BCAM table.

| address | vector |
|---------|--------|
| 1 | 0010 |
| 2 | 0111 |
| 3 | 1101 |
| 4 | 0101 |
| 5 | 0011 |
| 6 | 1011 |
| 7 | 0001 |

TABLE 2

Example of a BCAM function.

| $x_1$ | $x_2$ | $x_3$ | $x_4$ | $f_2$ | $f_1$ | $f_0$ |
|---|---|---|---|---|---|---|
| 0 | 0 | 0 | 0 | 0 | 0 | 0 |
| 0 | 0 | 0 | 1 | 1 | 1 | 1 |
| 0 | 0 | 1 | 0 | 0 | 0 | 1 |
| 0 | 0 | 1 | 1 | 1 | 0 | 1 |
| 0 | 1 | 0 | 0 | 0 | 0 | 0 |
| 0 | 1 | 0 | 1 | 1 | 0 | 0 |
| 0 | 1 | 1 | 0 | 0 | 0 | 0 |
| 0 | 1 | 1 | 1 | 0 | 1 | 0 |
| 1 | 0 | 0 | 0 | 0 | 0 | 0 |
| 1 | 0 | 0 | 1 | 0 | 0 | 0 |
| 1 | 0 | 1 | 0 | 0 | 0 | 0 |
| 1 | 0 | 1 | 1 | 1 | 1 | 0 |
| 1 | 1 | 0 | 0 | 0 | 0 | 0 |
| 1 | 1 | 0 | 1 | 0 | 1 | 1 |
| 1 | 1 | 1 | 0 | 0 | 0 | 0 |
| 1 | 1 | 1 | 1 | 0 | 0 | 0 |

[Definition 2] (TCAM)

An n input TCAM table with p products stores p ternary vectors. We assume that the TCAM stores p vectors from the address 1 to the address p, in order. Note that the address of each vector can be represented by m bits, where m is given by the above-mentioned equation (1). Each ternary vector consists of 0, 1, or * (don't care). The corresponding TCAM function: $f: \{0,1\}^n \rightarrow \{0,1\}^m$ satisfies the following conditions:

When the TCAM table has a vector that matches to the input x, the output $f(x)$ denotes the minimum address of the vector matching to the input vector. If no vector in the TCAM table match to the input vector x, $f(x)$ produces 0.

(End of Definition)

EXAMPLE 2

The TCAM shown in (Table 3) stores 7 ternary vectors. The corresponding TCAM function is shown in Table 4. Note that the input x=(1, 0, 1, 1) matches to the patterns stored in address 5 and 6. Since, 5 is smaller, the output of TCAM is (0, 1, 0, 1).

(End of Example)

TABLE 3

An example of TCAM table.

| address | vector |
|---------|--------|
| 1 | *010 |
| 2 | 0011 |
| 3 | 1101 |
| 4 | 1100 |
| 5 | *011 |
| 6 | 1*11 |
| 7 | *001 |

TABLE 4

An example of TCAM function.

| $x_1$ | $x_2$ | $x_3$ | $x_4$ | $f_2$ | $f_1$ | $f_0$ |
|---|---|---|---|---|---|---|
| 0 | 0 | 0 | 0 | 0 | 0 | 0 |
| 0 | 0 | 0 | 1 | 1 | 1 | 1 |
| 0 | 0 | 1 | 0 | 0 | 0 | 1 |
| 0 | 0 | 1 | 1 | 0 | 1 | 0 |
| 0 | 1 | 0 | 0 | 0 | 0 | 0 |
| 0 | 1 | 0 | 1 | 0 | 0 | 0 |
| 0 | 1 | 1 | 0 | 0 | 0 | 0 |

TABLE 4-continued

An example of TCAM function.

| $x_1$ | $x_2$ | $x_3$ | $x_4$ | $f_2$ | $f_1$ | $f_0$ |
|---|---|---|---|---|---|---|
| 0 | 1 | 1 | 1 | 0 | 0 | 0 |
| 1 | 0 | 0 | 0 | 0 | 1 | 0 |
| 1 | 0 | 0 | 1 | 1 | 1 | 1 |
| 1 | 0 | 1 | 0 | 0 | 0 | 1 |
| 1 | 0 | 1 | 1 | 1 | 0 | 1 |
| 1 | 1 | 0 | 0 | 1 | 0 | 0 |
| 1 | 1 | 0 | 1 | 0 | 1 | 1 |
| 1 | 1 | 1 | 0 | 0 | 0 | 0 |
| 1 | 1 | 1 | 1 | 1 | 1 | 0 |

The CAM function can be implemented by software, however, the software implementation is quite slow. Thus, in many cases, a CAM is implemented by a special hardware (semiconductor memory). In the following, we explain a conventional CAM implemented by hardware.

Figure 8:
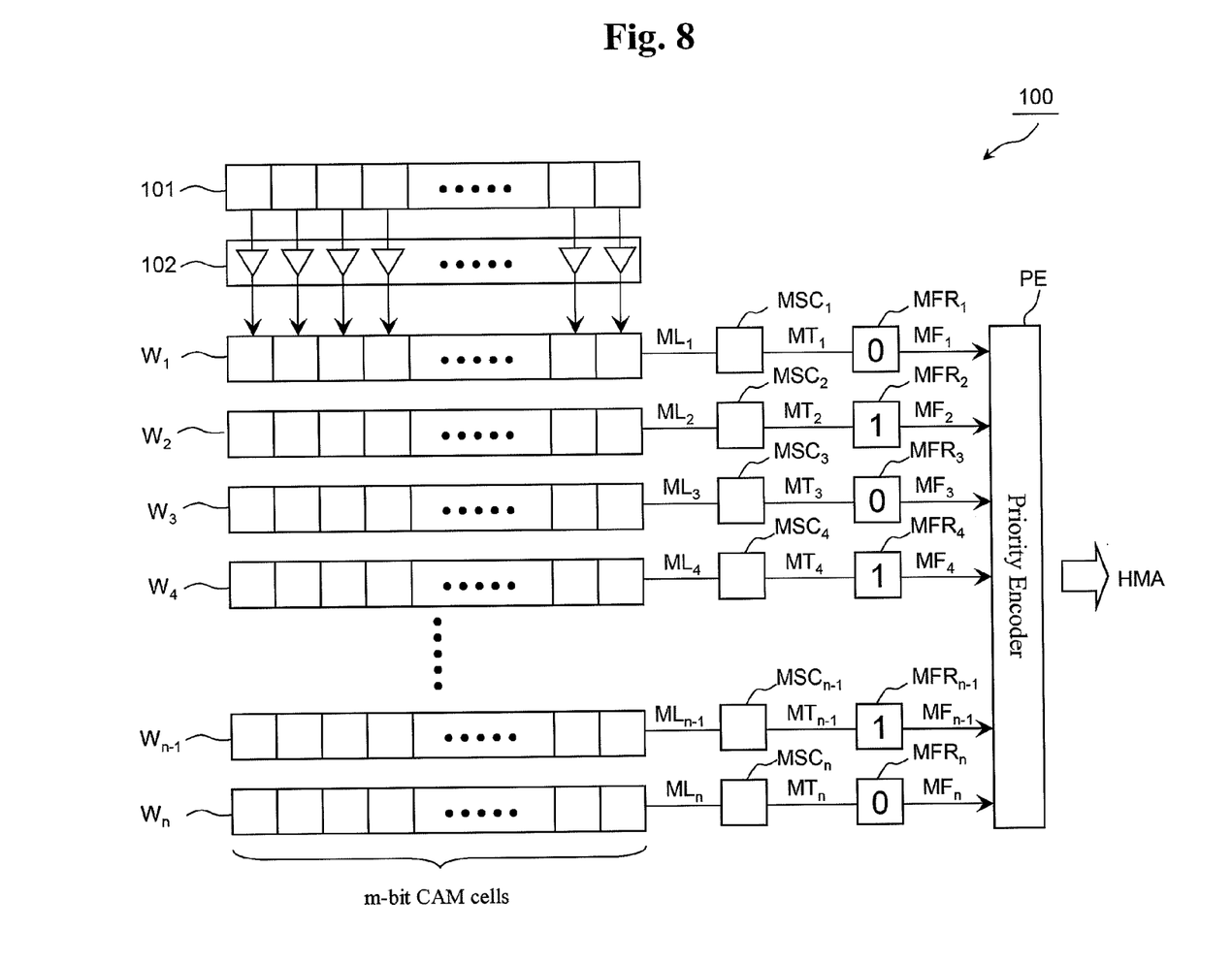
FIG. 8 is a block diagram of an example of a basic realization of a conventional CAM.

FIG. 8 is a block diagram showing an example of a basic realization of a conventional CAM (see Patent literature 1). CAM 100 consists of a comparison register 101, search bit line drivers 102, n words $W_1$~$W_n$, n match sense circuits $MSC_1$~$MSC_n$, n match flag registers $MFR_1$~$MFR_n$, and the priority encoder PE.

The comparison register 101 stores the m-bit search data. The search bit line driver 102 drives each bit of the comparison register 101 along the search bit line. Each of the words $W_1$~$W_n$ has m-bit CAM cells.

Figure 9:
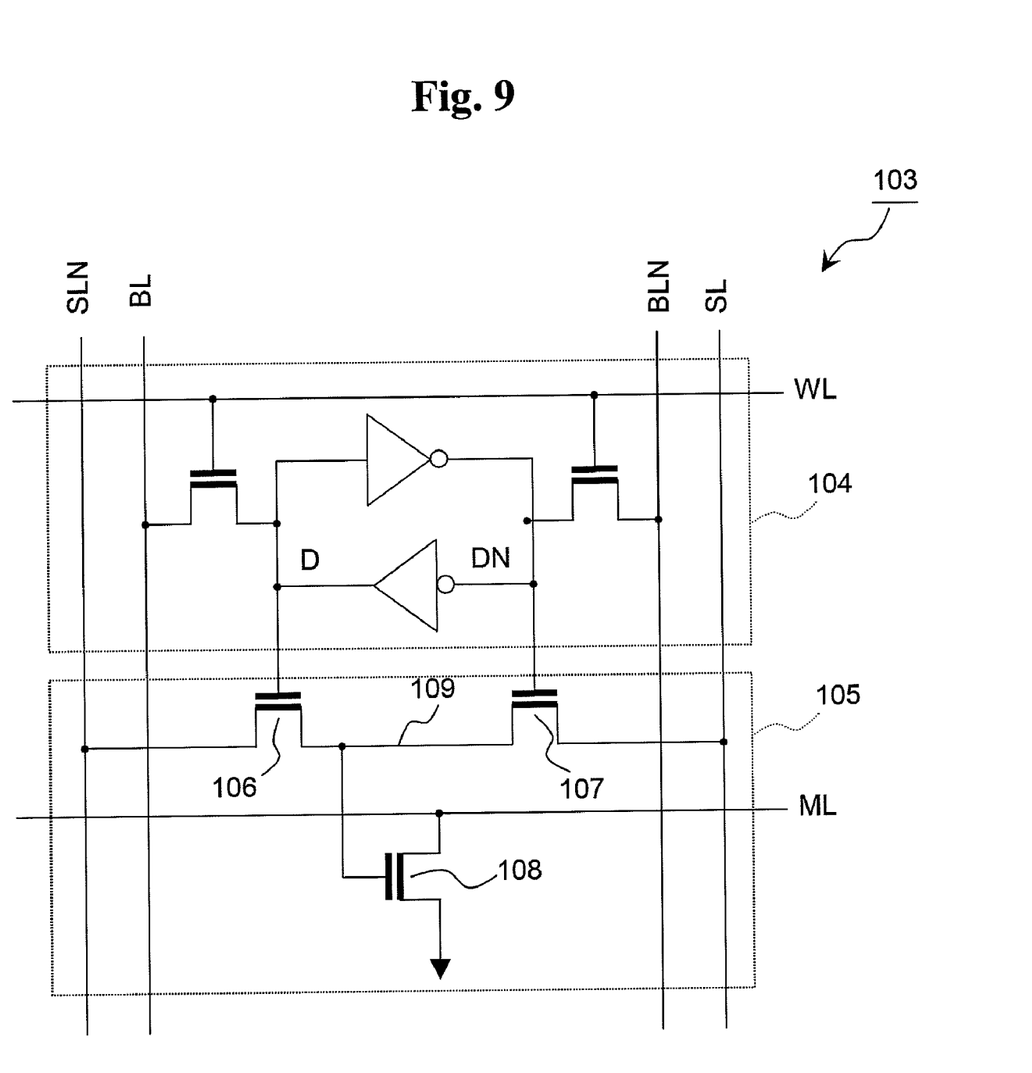
FIG. 9 is a diagram showing a realization of a circuit for a CAM cell in FIG. 8.

FIG. 9 is a circuit diagram of the CAM cell in FIG. 8. The CAM cell 103 illustrated in FIG. 9 detects the mismatch. The CAM cell 103 consists of a memory cell 104, and a comparison circuit 105. The memory cell 104 is a memory cell of SRAM storing 1-bit data. In FIG. 9, D denotes the data, and DN denotes the complement of the data. The comparator 105 compares the data stored in the memory cell 104, with the search data which is driven on the pairs of search bit lines SL and SLN, and produce comparison results to the match line ML.

The comparator 105 consists of three MOS transistors ("nMOS") 106, 107, 108. Two nMOS 106 and 107 are connected in series, and they are located between the search bit line SLN and the search bit line SL. The gates of nMOS 106 and 107 are connected to the data D input and the complement of the data DN input of the memory cells 104, respectively. nMOS 108 connects the match line ML and the grand. The gate of nMOS 108 is connected to the node 109 that is between nMOS 106 and 107.

First, before doing a search, data to be searched are stored in words in $W_1$~$W_n$ of CAM 100. In each CAM cell 103 of a word, the write operation of data to the memory cell 104, and the read operation of data from the memory cell 104, are done in a similar way to an ordinary SRAM.

To do the search operation, first, search data are stored in the comparison register 101. Each bit of the search data, is sent to the corresponding search bit line through the search bit line driver 102.

In each of words $W_1$~$W_n$, matching operations are done to the data stored in CAM cells and the search data sent to the search bit lines, simultaneously, and the results are sent to the match lines $ML_1$~$ML_n$. These search results are sent to the match sense circuit $MSC_1$~$MSC_n$. Each of the match sense circuits $MSC_1$~$MSC_n$, amplifies the search result, sent to the match flag output lines $MF_1$~$MF_n$, and sent to the match lines $MT_1$~$MT_n$, as the match sense output.

Each of the match sense output are stored in the match flag register $MFR_1$~$MFR_n$, and sent to the match flag lines $MF_1$~$MF_n$ as the match flag output. Note that the match flag '1' denotes "match", while '0' denotes "mismatch".

Each output of the match flag is sent to the priority encoder PE. The priority encoder PE, according to a predetermined priority, selects the address of the word with the highest priority (i.e., the highest priority match address:HMA) among the matched words, and produces the output. As for the priority of words, we assume that the word $W_1$ has the highest priority, and the priority will be lower as the index increases, and $W_n$, has the lowest priority.

Note that the matching search in the each CAM cell 103 in words $W_1$~$W_n$ is implemented as follows:

First, the initialization operation is performed. In the initialization operation, pairs of the search bit lines SL and SLN are set to both 'L'(='0') state. On the other hand, according to the data stored in the memory cell 104, one of nMOS 106 or 107 of the comparison circuit 105 is in the ON state, and the other nMOS is in the OFF state. Therefore, through the ON transistor, either nMOS 106 or 107, the voltage level of the node 109 that is located between nMOS 106 and 107, will be 'L', and the nMOS 108 will be the OFF state. In this state, the match lines ML are precharged to the 'H'(='1') state. Note that in the match line ML, 'H' denotes the "match".

Next, through the search bit line, each bit of the search data stored in the comparison register 101 is sent to each CAM cell 103. With this operation, according to the search data S, either one of the search bit line pair SL, SLN will be in the 'H' state, and the other will be in the 'L' state.

When the data D that is stored in the memory cell 104 match to the search data S, the level of the node 109 will be 'L', and the nMOS 108 is kept to be in the OFF state.

On the other hand, when the data D is different from the search data S, the level of the node 109 will be 'H', and nMOS 108 will be in the ON state. From this, the match line ML is discharged, and it will be in the 'L' state.

The match line ML of a CAM word consisting of m-bit CAM cells 103, forms a wired OR circuit, where nMOS 108 of CAM cells 103 are connected in parallel.

Thus, only when matches are detected in all the m bit CAM cells 103 that realize a word, the match line ML is kept in the 'H' (match) state. On the other hand, if a mismatch is detected in any of the CAM cells 103, the match line ML becomes to the 'L' ("mismatch") state.

For example, as a result of a search, assume that '0', '1', '1', '0 ', . . . , '1', '0' are stored in the match flag register $MFR_1$~$MFR_n$. In this case, matches are detected in the words $W_2$, $W_3$, . . . , $W_{n-1}$. Thus, the priority encoder PE, produces the address of the highest priority word $W_2$ as the HMA. Also, by clearing the match flags to '0' stored in the match flag register $MFR_2$, the circuit can produce the address of word $W_3$, the next highest priority address as the HMA. In a similar way, the circuit can produce the address of the word where the match is detected.

By the way, when the circuit is used as a TCAM, in the bit showing don't care, the pair of search bit lines SL and SLN must be set in the 'L'(='0') state.

Figure 10:
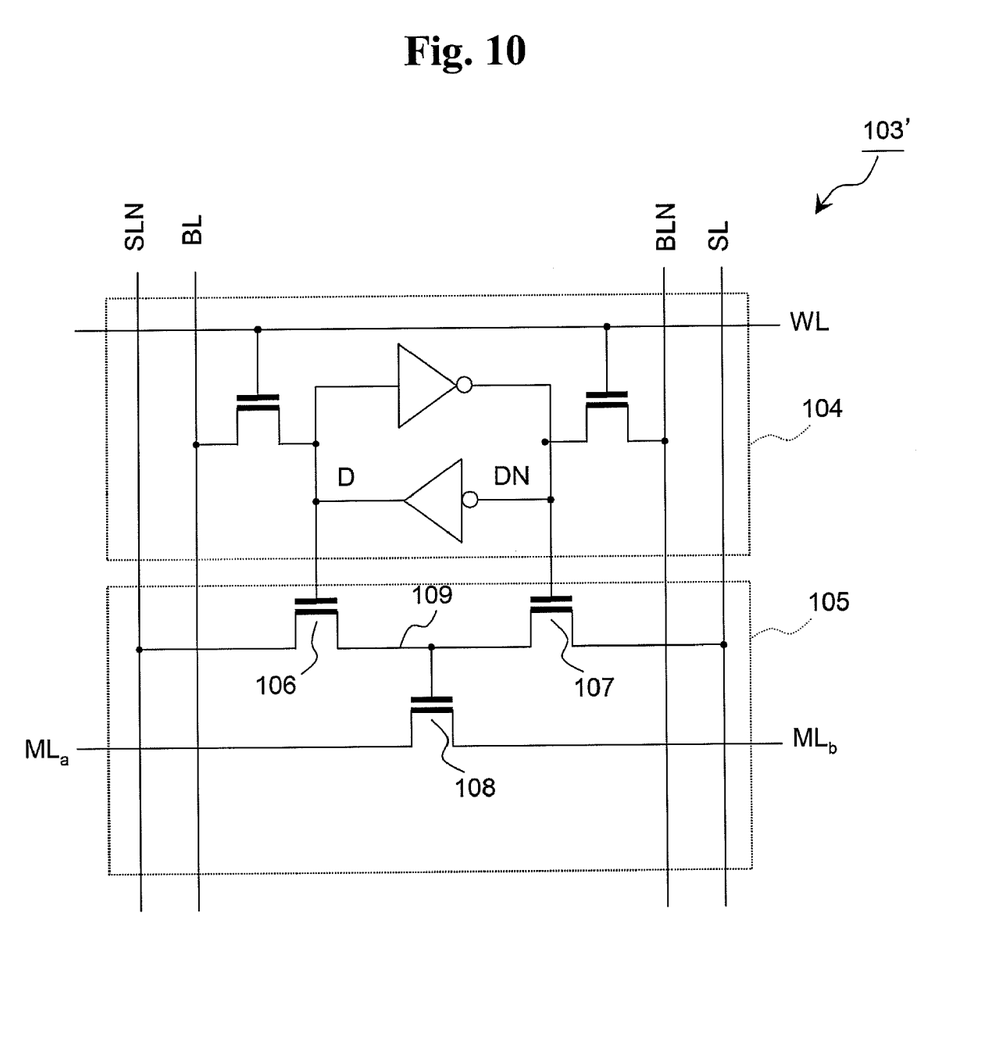
FIG. 10 is an another example of a realization of circuit for a CAM cell in FIG. 8.

FIG. 10 is the circuit diagram of a realization of other example that is different from the CAM cell shown in FIG. 8. The CAM cell 103' shown in FIG. 10 is "the match detection type". Similar to FIG. 9, it has the memory cells 104 of the SRAM realization, and the comparison circuit 105. The CAM cell 103' has the different connection in nMOS 108 of the comparison circuit 105, in the CAM cell 103 in FIG. 9. The nMOS 108 in FIG. 10, is between the match line $ML_a$ and the match line $ML_b$ to connect them. The gate of nMOS 108 is connected to the node 109 which is located between nMOS 106 and 107.

In CAM cell 103', when the search operation is performed, as the initialization operation, both of the bit line pair SL and SLN are set to 'H'. On the other hand, according to the data stored in the memory cell 104, either one of nMOS 106 or 107 of the comparison circuit 105 will be in the ON state, and the other nMOS will be in the OFF state. Thus, the through the transistor nMOS 106 or 107 having the ON state, the level of the node 109 will be 'H', and the state of nMOS 108 will be ON. In this state, a terminal of the match line ML is precharged to 'H'(='1'). Note that in the match line ML, 'H' denotes "mismatch".

In the match line ML of the CAM word consisting of m bit CAM cell 103', the nMOS 108 of CAM cells 103' are connected in series to form the AND network. Thus, the match lines $ML_a$, $ML_b$ are precharged to 'H' through the nMOS 108 of the CAM cell 103'.

After that, through the search bit line, bits of the search data stored in the comparison register 101 are sent to the CAM cells 103'. By this operation, according to the search data S, either one of the search bit line pair SL and SLN will be 'H' and the other will be 'L'.

When the data D stored in the memory cell 104 matches to the search data S, the level of the node 109 will be 'H', and the state of nMOS 108 is kept ON.

On the other hand, when data D and search data S do not match, the level of the node 109 will be 'L', and the nMOS 108 will be in the OFF state.

After all the states of the CAM cells 103' of m-bit of the CAM word is determined, from the one end of the match line ML, the discharge starts, and the other end of the line, determine the comparison result. In this case, when there exist any mismatch CAM cell 103', the comparison result will be 'H', that is, kept in the mismatch state. On the other hand, only when the matches are detected in all the CAM cells 103', the comparison result will be 'L', that is, the match state.

By the way, when the circuit is used as a TCAM, the pair of search bit lines SL and SLN must be in the 'H'(='1') state for the don't care bits.

REFERENCE

[Patent Literature 1]
Japanese Unexamined Patent Application Publication No. 2004-295967
[Patent Literature 2]
Japanese Unexamined Patent Application Publication No. 2003-389264
[Patent Literature 3]
Japanese Unexamined Patent Application Publication No. 2004-258799
[Patent Literature 4]
Japanese Unexamined Patent Application Publication No. 2004-258799
[Non-Patent Literature 1]
S. Kohyama (ed.), Very High Speed MOS Device: Very high speed device Series, The first edition, Baifu-Kan Pub. Co., February 1986, pp. 324-325 (in Japanese).
[Non-Patent Literature 2]
IEICE, LSI Handbook, The first edition, Ohm-Sha Pub. Co., November 1994, pp. 523-525 (in Japanese).
[Non-Patent Literature 3]
Kostas Pagiamtzis and Ali Sheikholeslami, "A Low-power content-addressable memory (CAM) using pipelined hierarchical search scheme", IEEE Journal of Solid-State Circuits, Vol. 39, No. 9, September 2004, pp. 1512-1519.

[Non-Patent Literature 4]
T. Sasao, M. Matsuura, and Y. Iguchi, "A cascade realization of multi-output function for reconfigurable hardware", International Workshop on Logic and Synthesis (IWLS01), Lake Tahoe, Calif., Jun. 12-15, 2001, pp. 225-230.
[Non-Patent Literature 5]
T. Sasao and M. Matsuura, "BDD representation for incompletely specified multiple-output logic functions and its applications to functional decomposition," Design Automation Conference, June 2005, pp. 373-378.
[Non-Patent Literature 6]
Y. Iguchi and T. Sasao "On the LUT cascade architecture," The 2003 National Convention of IEE Japan, Electronics, Information, and System Group, MC2-4, Aug. 29, 2003, Akita University, Japan (in Japanese).

DISCLOSURE OF THE INVENTION

Problems to be Solved by the Invention

The above-mentioned conventional CAM is faster than RAM, since it can search data in parallel. However, the realization of the device is more complex. Thus, the price per bit (bit cost) is 10~30 times higher than RAM.

Also, the power dissipation of the CAM is much larger than that of RAM, per bit (See Non-patent literature 3). This is because, in the CAM, all the cells are accessed at the same time, as explained before. Thus, the power dissipation per bit can be up to 50 times of an ordinary RAM.

Thus, the purpose of this invention is to provide the low power associative memory requiring small implementation area by using simple device structure.

Means for Solving the Problem

From here, we will show the definitions and theories necessary to understand this invention, and then, we will explain the method to realize the function in this invention.

[1] Property of CAM Functions
[Definition 3] (Decomposition Chart, Standard Decomposition Chart, Column Multiplicity)

Assume that the function $f(X): B^n \to B^q$, and $X=(x_1, x_2, \ldots, x_n)$ are given. Where, $B=\{0, 1\}$. Let $(X_L, X_H)$ be a partition of X. The "decomposition chart" of $f$ is, a two-dimensional matrix, where the columns labels denote all possible assignment of elements of B to $X_L$, and the rows labels denote all possible assignment of elements of B to $X_H$. And the corresponding matrix value is equal to $f(X_L, X_H)$.

Among the decomposition charts for the function $f$, the one where $X_L=(x_1, x_2, \ldots, x_{nL})$, and $X_H=(x_{nL+1}, x_{nL+2}, \ldots, x_n)$ is the "standard decomposition chart".

The number of different column patterns in the decomposition chart is the "column multiplicity".

Note that, as a special case of the decomposition chart, we also consider the case of $X_L=X$.
(End of Definition)
[Definition 4] (C-Measure)

Let $f$ be a logic function, and let $(x_1, x_2, \ldots, x_n)$ be the order of variables. Then, the maximum Value of the column multiplicity of the standard decomposition chart for $f$ is the "C-measure" of $f$.
(End of Definition)

EXAMPLE 3

The C-measure of the function
$$f_1 = x_1 x_2 \vee x_3 x_4 \vee x_5 x_6$$
three, while the C-measure of the function
$$f_2 = x_1 x_5 \vee x_2 x_6 \vee x_3 x_4$$
is eight.

(End of Example)

The column multiplicity of the decomposition chart for $f$ is equal to the width of the MTBDD (multi terminal binary decision diagram). Thus, the C-measure of a logic function $f$ is equal to the maximum width of the MTBDD with the given ordering of the input variables. For a given logic function $f(x_1, x_2, \ldots, x_n)$, the C-measure can be easily computed, and is unique. To be explained later, the function with a small C-measure can be efficiently implemented by an LUT (Lookup table) cascade. Thus, the C-measure is a measure showing the complexity of the logic function realized by an LUT cascade.

[Lemma 1]

For a given function $f$, let p be the number of the input combinations that produce non-zero outputs. Then, the C-measure of $f$ is at most p+1.

(End of Lemma)

[Theorem 1] (C-Measure of a BCAM Function)

Assume that the BCAM table is given, where p is the number of products in the table. Then, the C-measure of the BCAM function is at most p+1.

(End of Theorem)

[Theorem 2] (C-Measure of a TCAM Function)

Assume that the TCAM table is given, where p is the number of products in the table, and each vector has at most k don't cares. Then, the C-measure of the corresponding TCAM function is at most $2^k p+1$.

(End of Theorem)

[2] LUT Cascade

A CAM function can also be realized by an ordinary RAM. For example, the above-mentioned BCAM function shown in Table 1 having 7 elements, can be realized by a RAM with 16 words as shown in Table 2. Where, each word consists of 3 bits. When we realize an n-input CAM function by a single RAM, even if the BCAM contains only a few vectors, the size of the RAM is proportional to $2^n$. However, by using an LUT cascade, we can drastically reduce the size of memory (See Patent literature 3).

[Theorem 3]

For a given function $f$, let $X_L$ correspond to the row variables and let $X_H$ correspond to the column variables of the decomposition chart, and let μ be the column multiplicity of the decomposition chart. Then, the function $f$ can be realized by the network shown in FIG. 1. In this case, the number of signal lines that connect two blocks H and G (hereafter, it is denoted by the "number of rails") is at most

Figure 1:
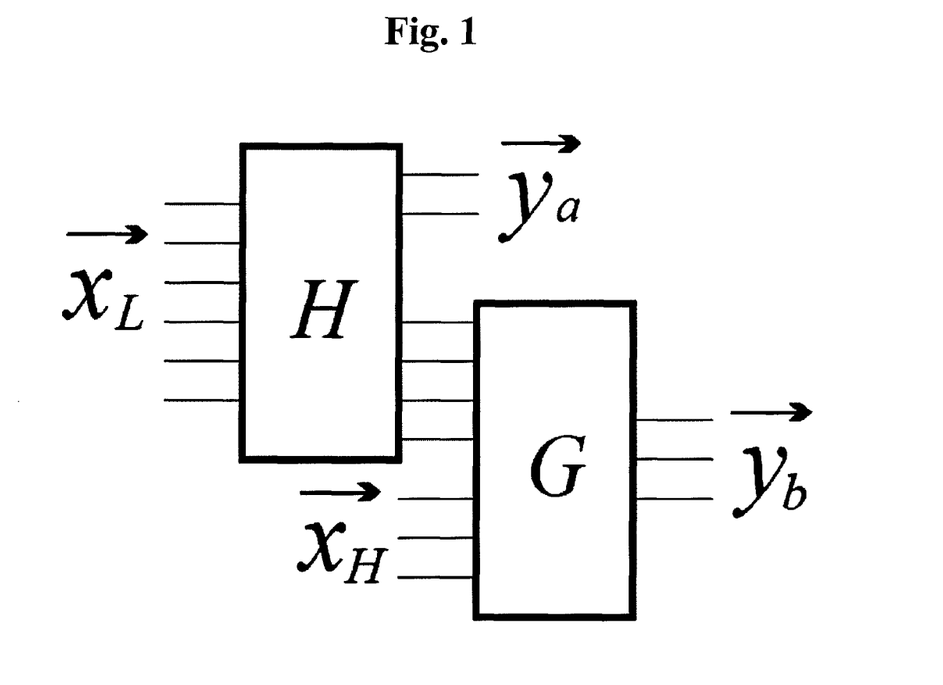
FIG. 1 shows the functional decomposition of a logic function.

[Expression 2]

$$\lceil \log_2 \mu \rceil \quad (2)$$

(End of Theorem)

Figure 2:
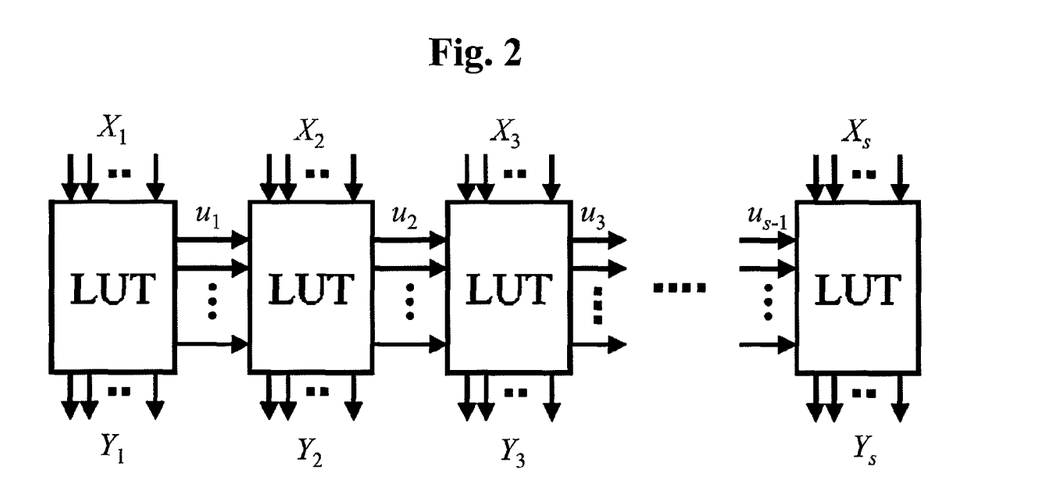
FIG. 2 shows the LUT cascade with the intermediate outputs.

When the number of signal lines that connect two blocks is smaller than the number of variables in $X_L$, there is a chance to reduce the total amount of memory to realize the function. Such method is a "functional decomposition". By recursively decomposing the given function, we have an LUT cascade shown in FIG. 2 (See Non-patent literature 4). An LUT cascade consists of "cells", and signal lines connecting adjacent cells are "rails". A logic function with a small C-measure can be implemented by a compact LUT cascade. To obtain the C-measure, we need not use a decomposition chart, but we can efficiently compute it from the binary decision diagram that represents the characteristic function of the multiple-output function ("BDD_for_CF") (See Patent literature 2, and Non-patent literature 5).

[Theorem 4]

A logic function with C-measure μ can be realized by an LUT cascade using cells having at most

[Expression 3]

$$\lceil \log_2 \mu \rceil + 1 \quad (3)$$

inputs and

[Expression 4]

$$\lceil \log_2 \mu \rceil \quad (4)$$

outputs.

(End of Theorem)

[Theorem 5]

Consider a function $f$. Let n be the number of input variables, s be the number of cells, r be the maximum number of rails (i.e., the number of signal lines between cells), k be the maximum number of inputs to the cell, and μ be the C-measure of the function $f$. Then, there exist an LUT cascade having the following relation:

[Expression 5]

$$k > r, r = \lceil \log_2 \mu \rceil \quad (5)$$

and

[Expression 6]

$$s \leq \lceil \frac{n-r}{k-r} \rceil. \quad (6)$$

(End of Theorem)

[3] A Design Method Using Don't Cares.

[3-1] Design Method for a BCAM Function

In a BCAM function, we assume that the number of non-zero outputs in the truth table is much smaller than the total number of the combinations $2^n$. In other words, the following (Assumption 1) holds.

(Assumption 1)

Let n be the number of input bits in the BCAM table and let p be the number of vectors, then $p \ll 2^n$.

For example, consider the BCAM with n=32 and p=1000, the ratio of non-zero outputs to the number of all possible minterms is $1000/2^{32} = 2.3 \times 10^{-7}$.

When a BCAM function is represented by a BDD, the maximum width of the BDD is not greater than the C-measure of the function. From Theorem 1, we can see that the number of the rails is at most p+1. However, in the most levels, the with of the BDD is near to p+1. Therefore, when the BCAM function is implemented by an LUT cascade, we need many cells whose number inputs are

[Expression 7]

$$\lceil \log_2(p+1) \rceil + 1 \quad (7)$$

Figure 3:
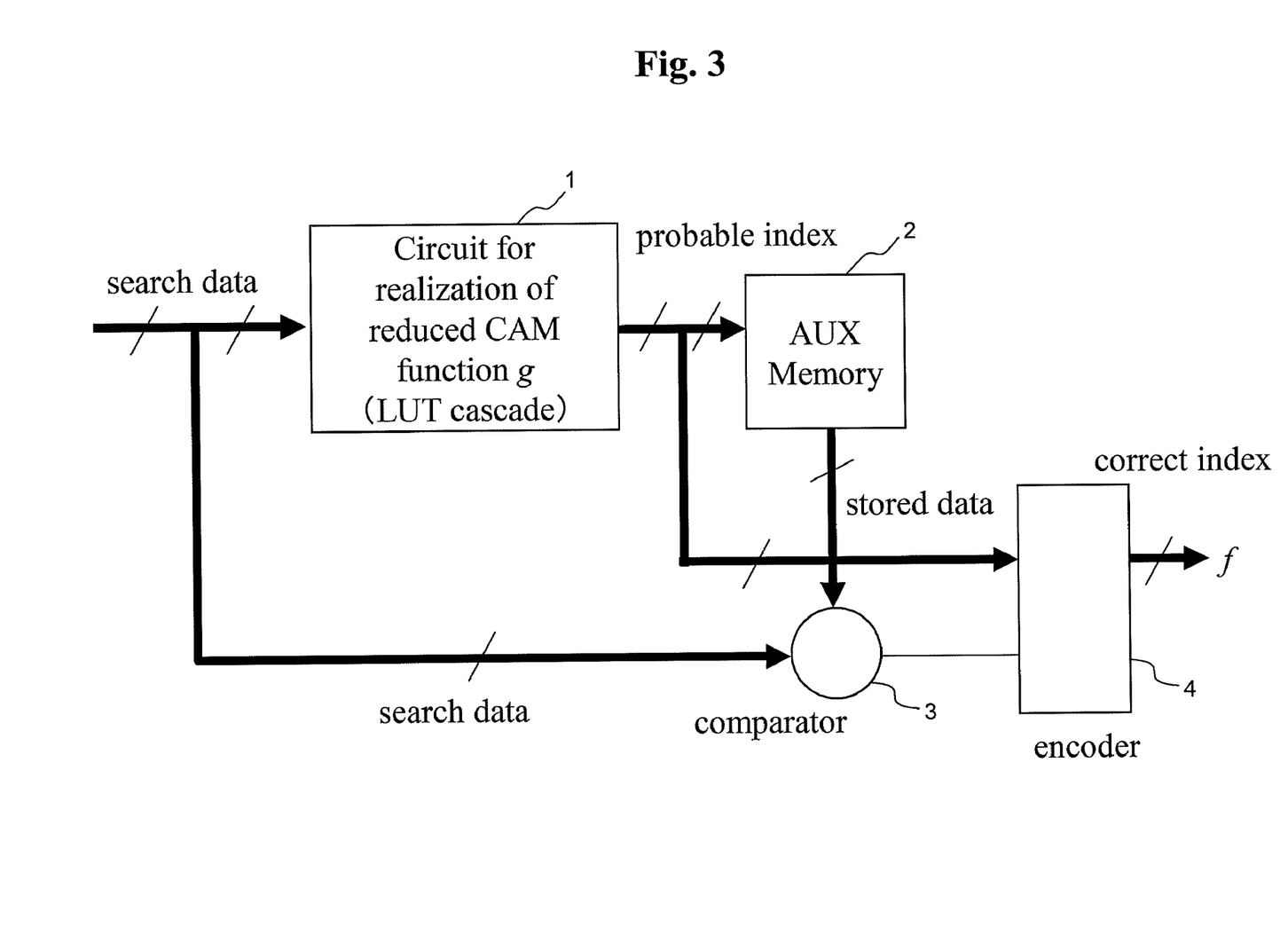
FIG. 3 explains the realization method of a CAM function with don't cares.

From here, we are going to explain the reduction method of the hardware to implement the BCAM function, with the concept of don't care, using FIG. 3.

[Algorithm 1]

(1) Let $f$ be a BCAM function. In $f$, for the unregistered vectors in the CAM, replace the all the outputs by don't cares, to obtain g.

(2) Generate the binary decision diagram representing the characteristic function for g, (BDD_for_CF), and simplify it.

(3) From the simplified BDD, generate LUT cascade 1. In general, LUT cascade 1, is simpler than the LUT cascade realizing $f$ (called "exact LUT cascade").

(4) When the search data match to the registered data, LUT cascade 1 produces the correct value. When the search data do not match to any of the registered data, LUT cascade 1 may produce an incorrect value.

(5) To fix the error, we use the auxiliary memory 2 with m inputs and n outputs, where m is given by:

[Expression 8]

$$m = \lceil \log_2(p+1) \rceil \quad (8)$$

The auxiliary memory 2 stores the corresponding data of the BCAM table in each address.

(6) LUT cascade 1 produces index as the output, and send it to the auxiliary memory 2. And the auxiliary memory 2 produces the corresponding registered data. The comparator 3, compares the input data with the outputs of the auxiliary memory 2. If they are the same, then the output value of LUT cascade 1 is guaranteed to be correct. In this case, encoder transfer the index produced by LUT cascade 1 to the external output. On the other hand, if the output data of the auxiliary memory 2 is different from the input data, then there is no vector in the CAM. In this case, encoder 4 produce the index that denotes the 'invalid' (0).

(End of Algorithm)

The total number of bits in the auxiliary memory 2 is $n2^m$, and the cost of the hardware is negligibly smaller than that of LUT cascade 1.

[3-2] Design Method for TCAM Function

In the case of TCAM function, the entries in the TCAM table are ternary, and auxiliary memory 2 has m inputs and 2n outputs. Also, in the comparator, the bits that correspond to don't care are ignored. For other parts, the operations are the same as the BCAM.

[4] Constitution of Present Invention

With the constitution of the address generator according to the present invention, an associative memory that produces a unique index corresponding to an input data, comprising:

a simplified functional processing unit (SFPU), implemented by an LUT logic network or by a PLA (Programmable Logic Array), that implements a function g (hereinafter referred to as "simplified CAM (Content Addressable Memory) function"), where g is the function derived from $f$ by replacing the value showing "invalid" with the don't care, and $f$ (hereinafter referred to as "CAM function") is a function that produces the unique index for a given input data;

an auxiliary memory that stores the inverse function $f^{-1}$ of said CAM function $f$; and a output modifier that checks whether the output value of said SFPU is equal to the output value of the CAM function $f$; wherein said SFPU produces the operational value (hereinafter referred to as "tentative index value") for said simplified CAM function g as the address for said auxiliary memory;

said auxiliary memory produces the value of the inverse function $f^{-1}$ when the tentative index value is applied to the read address;

said output modifier compares the input data with said value of the inverse function $f^{-1}$ produced by the auxiliary memory, and produces the output of said SFPU if they are the same, otherwise produces the signal showing the "invalid" when they are different.

With this constitution, an LUT logic network can be implemented by plural ordinary RAMs. Also, the auxiliary memory can be implemented by an ordinary RAM. Also, instead of realizing the original CAM function $f$, the reduced function g, which can be obtained from $f$ by replacing the values showing the "invalid" with don't cares, can be implemented by LUT network or by a PLA to reduce the necessary amount of memory. Thus, as a whole, we can implement a CAM function in a smaller area than the conventional CAM, by using a simpler device structure.

Also, by using an ordinary RAM to implement the CAM function, the use the special CAM circuit can be avoided. Thus, in addition to implement by an ASIC, the CAM function can be easily implemented by programmable logic device such as FPGAs (Field Programmable Gate Arrays) or CPLDs (Complex Programmable Logic Devices) embedding general-purpose RAMs, in lower cost.

Also, except for the means for decision, the circuit can be implemented by ordinary RAMs.

And, for a single search operation, a value of a tentative index can be obtained by a several RAM access (the number of RAM access in an LUT network, plus one). In a each RAM access, only one address is accessed in a RAM. As a whole, the value of the tentative index can be obtained by several RAM access. Therefore, the power dissipation can be greatly reduced compared with a conventional CAM.

On the other hand, as for the speed, it is slower than the conventional CAM. But, it is much faster than the ordinary method that searches the RAM using a CPU.

In this case, the "LUT logic network" denotes the circuit that is obtained by LUTs (Look-Up Tables) in a cascade structure, or in a network structure. However, it does not limited to the circuit consisting of LUTs that are physically placed and interconnected. For example, the LUT network can be implemented by a sequential network, wherein a single memory contains plural LUTs, and selected LUTs are sequentially changed, and the output value of the memory (LUT) is feed-back to the input of the memory as the read address.

Note that this invention can be applied to implement both BCAM and TCAM.

Effect of the Invention

As shown above, this invention provides an associative memory with a high-speed search capability, and low-power dissipation, requiring small implementation area using simple device structure.

EXPLANATION OF REFERENCES

1: LUT cascade
2: Auxiliary memory

3: Comparator
4: Encoder
5: Reduced function operation unit
6: Auxiliary memory
7: Output modifier
10: Associative memory
11: Input variable register
12-1~12-s: Memory for logic
13: Output variables register
21: EXNOR gate
22: AND gate
23: AND gate
31: pq element

BEST MODE FOR CARRYING OUT THE
INVENTION

From here, we are going to explain the best form for carrying out the invention, by using the drawing.
(Embodiment 1)

Figure 4:
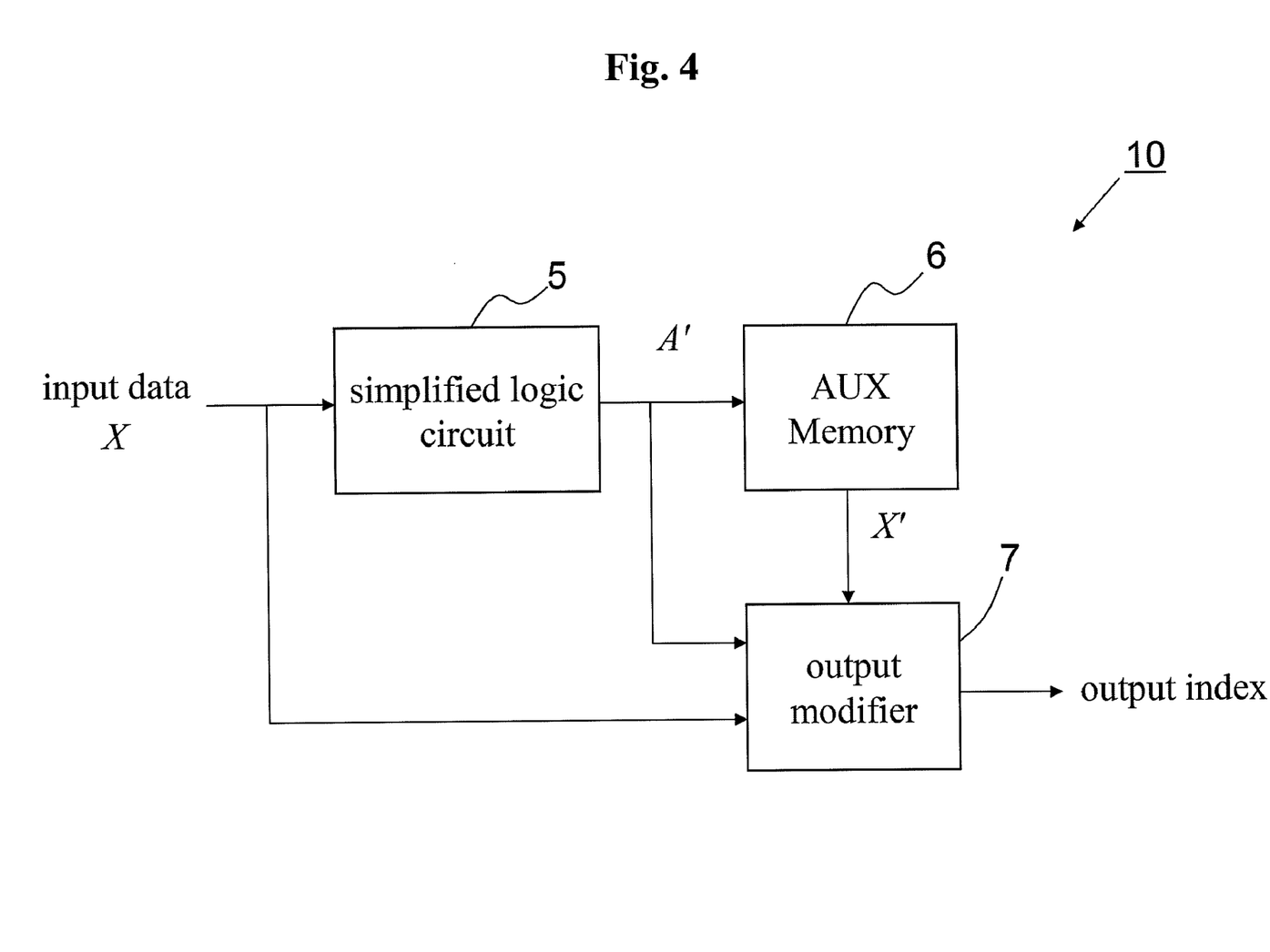
FIG. 4 shows the whole realization of the associative memory of Embodiment 1 of this invention.

FIG. 4 shows the whole realization of an associative memory concerning Embodiment 1 in this invention. In this embodiment, the associative memory 10, consists of the reduced function operation unit 5, the auxiliary memory 6, and the means for decision of the coincidence 7.

The associative memory 10, produces the unique index $A=(a_1, \ldots, a_m)$ for an n-bit input data $X=(x_1, \ldots, x_n)$ that are supplied from the external network. The input data X is applied to the reduced function operation unit 5 and the output modifier 7.

From here, F denotes the CAM function that produces the corresponding unique index A for an input data X. Also, G denotes the simplified CAM function that is obtained from the CAM function F, by replacing the values that show the 'invalid' with don't cares.

The reduced functional operation unit 5 consists of the LUT network that implements a simplified CAM function G. The reduced functional operation unit 5, produces an tentative index A'=G(X) for an input data X. The tentative index A' is sent to the auxiliary memory 6, and the output modifier 7.

The auxiliary memory 6 stores the inverse function $F^{-1}$ of the CAM function F. That is, an LUT stores the function producing the corresponding data X for the unique index A. The auxiliary memory 6, receives the tentative index A' that is produced by the reduced functional operation unit 5, and produces the inverse data $X'=F^{-1}(A')$. The tentative index A' is send to the means to decide coincidence 7.

The means to decide the coincidence 7 compares the input data X with the inverse data X' to check the equality, and decides whether they are the same. When they are the same it produces the tentative index A' as the output index A, while when they are different, it produces the value showing 'invalid'.

Figure 5:
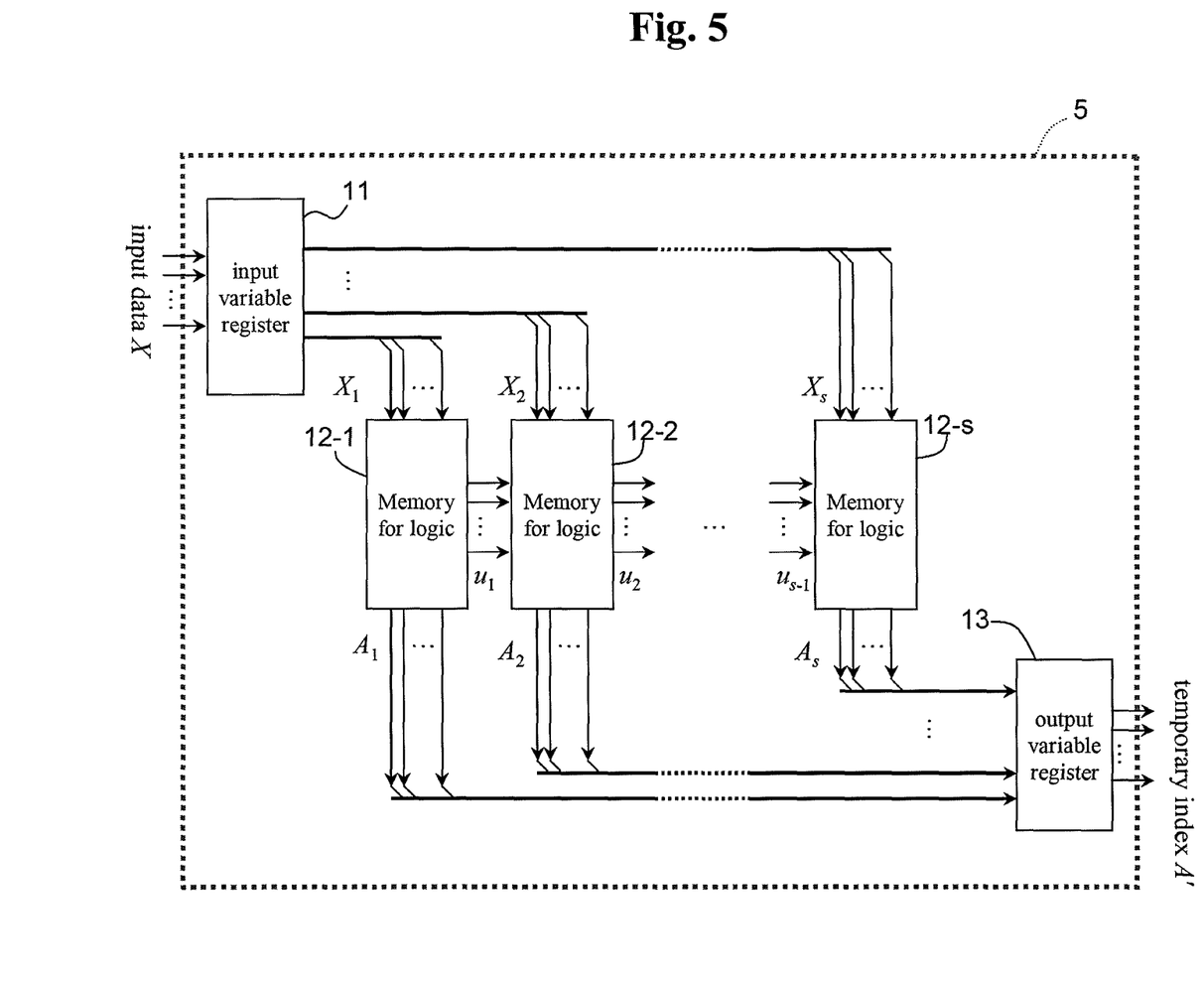
FIG. 5 shows a realization of reduced function operation unit 5 in FIG. 4.

FIG. 5 shows the realization of simplified functional operation unit 5 of FIG. 4. In Embodiment 1, as the simplified functional operation unit 5, we used an LUT cascade circuit.

The simplified functional operation unit 5, consists of the input variable register 11, the memories for logic 12-1~12-s, and the output variables register 13.

The input variable register 11 temporarily stores the input data X given from the external inputs. In the memories for logic 12-1~12-s store the subfunctions $G_1, \ldots, G_s$ are stored as LUTs. When $X=(X_1, X_2, \ldots, X_s)$ is a partition of X, the subfunctions $G_1, \ldots, G_s$ are given as follows:

[Expression 9]

$$\begin{aligned}(A'_1, R_1) &= G_1(X_1) \\ (A'_2, R_2) &= G_2(X_2, R_1) \\ &\vdots \\ (A'_{s-1}, R_{s-1}) &= G_{s-1}(X_{s-1}, R_{s-2}) \\ A'_s &= G_s(X_s, R_{s-1}) \\ A' &= (A'_1, A'_2, \ldots, A'_s)\end{aligned} \quad (9)$$

Here, vectors $A'_1, A'_2, \ldots, A'_{s-1}$ denote the intermediate outputs of the LUT cascade, and the vector $A'_s$ denote the external output of the LUT cascade. The tentative index A' is represented as a function of these vectors. Also, the vectors $R_1, R_2, \ldots, R_{s-1}$ represent the intermediate variables of the LUT cascade.

The output variables register 13 stores the intermediate outputs $A'_1, A'_2, \ldots, A'_{s-1}$ and the final output $A'_s$, produced by the memories for logic 12-1~12-s, and produces the tentative index A'.

Note that, the detailed operation of an LUT cascade is shown in the patent literature 4, and a non-patent literature 6. Thus, we omit the explanation.

Figure 6:
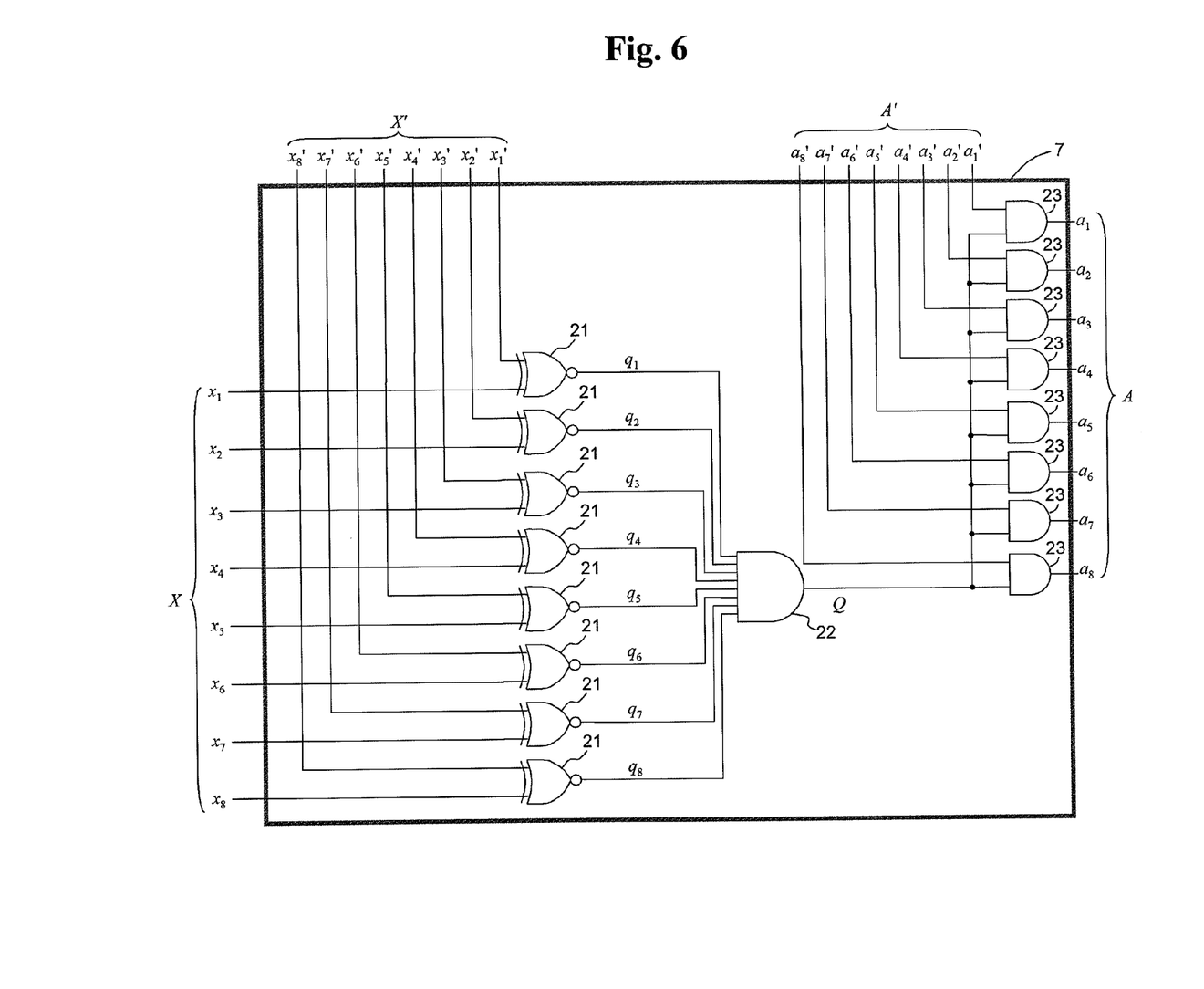
FIG. 6 shows a realization of a output modifier 7 in FIG. 4.

FIG. 6 shows realization of the output modifier 7 shown in FIG. 4. FIG. 6 shows an example, where the input data X has 8 bits and the output index A has 8 bits. However, the numbers of bits for the input data X and the output index A need not be 8.

The output modifier 7 consists of the EXNOR gate 2, where each input corresponds to each bit of the input data X, and the AND gate 23, where each input corresponds to each bit of the output index A.

Each bit of the input data X and the inverse data X', i.e., $x_i$, $x'_i (i=1, 2, \ldots, 8)$ are connected to the corresponding EXNOR gate 21 to perform the EXNOR operation. The operation results of the EXNOR gates 21 is sent to the AND gates 22 to perform the AND operations. The output Q of the AND gate 22 is called the coincidence decision signal.

On the other hand, each bit of the tentative index A', $a'_1$, $a'_2, \ldots, a'_8$ is applied to an input terminal of the AND gate 23. Also, to the other input terminal of the AND gate 23, the coincidence decision signal Q is applied.

From here, we will explain the operation of the associative memory 10 of this embodiment realized as shown above.

First, when the input data X is applied from the external network, the reduced functional operation unit 5 performs the operation of the CAM function G(X), and produces the result as the tentative index A'. If the registered vector exist for the input data X, then A', the value of the tentative index, is the correct index value. On the other hand, if no registered vector exists for the input data X, then the value of the tentative index A' may be incorrect. Thus, although the tentative index A' may be correct, we cannot see whether it represent the correct index or not.

Next, the tentative index A' is applied to the auxiliary memory 6. The auxiliary memory 6 performs the LUT operation of the output function $F^{-1}(A')$ to the tentative index A', and produces the inverse data $X'=F^{-1}(A')$ as the output. Note that, if the tentative index A' is the correct index, then the inverse data X' is equal to the input data X. However, when the tentative index A' is produced by the don't care assignment, the tentative index A' may be an incorrect value, and the inverse data X' denotes the 'invalid value'.

Next, to the i-th EXNOR gate 21 (i=1, 2, . . . , 8) of the output modifier 7, $x_i$, the i-th component of the input data X, and the i-th component of the inverse data X' are applied. The EXNOR gate 21 performs the logic operation:

[Expression 10]

$$q_i = \overline{x_i \oplus x'_i} \quad (10)$$

to produce the value $q_i$. The operational value $q_i$ is 1 if $x_i$ equals $x'_i$, and 0 if they are different.

Each operation $q_i$ is applied to the AND gate 22 to perform the AND operation. From this, when each component of the input data X and the inverse data X' are the exactly the same, the coincidence decision signal Q becomes 1, and for the other case, the coincidence decision signal Q becomes 0.

Therefore, by using the coincidence decision signal Q, we can check whether the tentative index A' shows the correct index value or not.

To the i-th AND gate 23 (i=1, 2, ..., 8), $a'_i$, i.e., the i-th component of the tentative index A' and the coincidence decision signal Q are applied. Next, each AND gate 23 performs the AND operation to produce $a_i$ as the i-th component of the output index A. From this, when the tentative index A' show the correct index value, the output index A equal to the correct index value, and for other case, 0 is produced as the output index A.

In this way, the CAM function operation is performed for the input data X. As explained above, in this embodiment, the reduced functional operation unit 5 and the auxiliary memory 6 are implemented by memories, and we can use ordinary RAMs for them. Therefore, by the refinement of the LSI process, we can reduce the size of the network size. Also, since they are memories, the power dissipation can be reduced by making them into the low-power state when they are idle.

(Embodiment 2)

Whole realizations of the associative memory and the realization of the output modifier 7 concerning to Embodiment 2 are similar to FIG. 4 and FIG. 6, respectively. So, we omit the explanation. In the associative memory in Embodiment 2, the realization of the reduced functional operation unit 5 is different from that of Embodiment 1.

Figure 7:
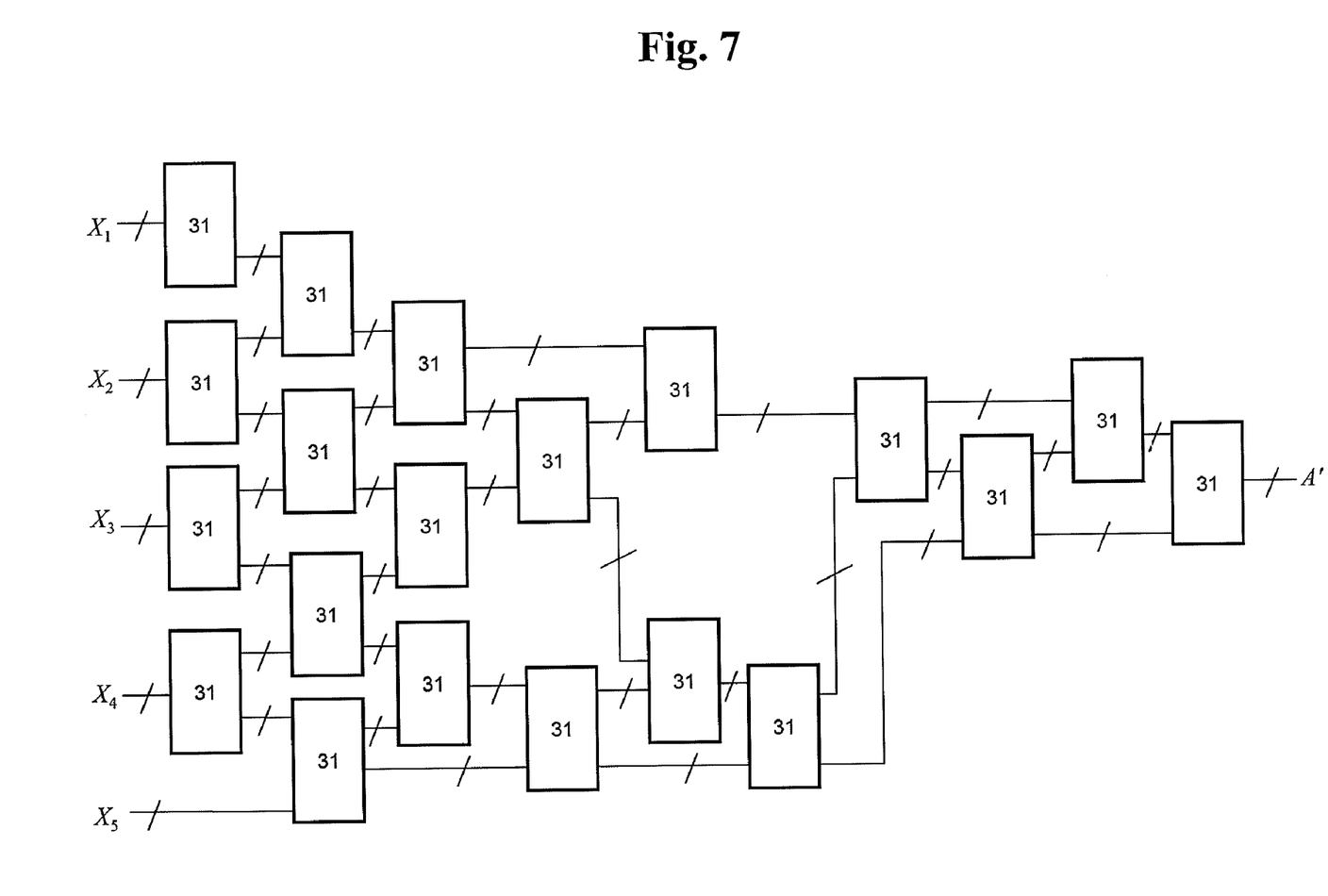
FIG. 7 shows the realization of a means for the coincidence decision 7 in Embodiment 2 of the associative memory.

FIG. 7 shows the realization of the reduced functional operation unit 5 of the associative memory in Embodiment 2. In this embodiment, the reduced functional operation unit 5 consists a network realized by plural pq elements 31. Note that a pq element 31 is a p input q output memory. For each pq element 31, the values of p and q may be chosen for each pq element 31. Each pq element 31 stores one of subfunctions $G_1, G_2, \ldots$ that is obtained by decomposing the simplified CAM function G, as an LUT. The network that are obtained by connecting plural pq elements 31 to form a network structure is called "pq network".

Note that, the realization shown in FIG. 7 is an example, and the method of interconnection of pq elements 31 may be changed for the given CAM function G.

In this way, we can realize an associative memory, similarly to Embodiment 1, even if we use pq-network to implement the simplified functional operation unit 5.

What is claimed is:

1. An associative memory that produces a unique index corresponding to an input data, comprising:
   a simplified functional processing unit (SFPU), implemented by an LUT logic network or by a PLA (Programmable Logic Array), that implements a function g (hereinafter referred to as "simplified CAM (Content Addressable Memory) function"), where g is a function derived from $f$ by replacing a value showing "invalid" with the don't care, and $f$ (hereinafter referred to as "CAM function") is a function that produces the unique index for the input data;
   an auxiliary memory that stores an inverse function $f^{-1}$ of said CAM function $f$; and
   a output modifier that checks whether an output value of said SFPU is equal to an output value of the CAM function; wherein
   said SFPU produces an operational value (hereinafter referred to as "tentative index value") for said simplified CAM function as an address for said auxiliary memory;
   said auxiliary memory produces a value of the inverse function $f^{-1}$ when the tentative index value is applied to a read address;
   said output modifier compares the input data with said value of the inverse function $f^{-1}$ produced by the auxiliary memory, and produces the output value of said SFPU if they are the same, otherwise produces a signal showing the "invalid" when they are different.

2. The associative memory as claimed in claim 1, wherein said LUT logic network is an LUT cascade logic circuit.

3. The associative memory as claimed in claim 1, wherein said LUT logic network is a pq network.

* * * * *